United States Patent
Hayashi

(10) Patent No.: US 7,759,793 B2
(45) Date of Patent: Jul. 20, 2010

(54) SEMICONDUCTOR DEVICE HAVING ELASTIC SOLDER BUMP TO PREVENT DISCONNECTION

(75) Inventor: Eiji Hayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 118 days.

(21) Appl. No.: 11/792,955

(22) PCT Filed: Dec. 13, 2004

(86) PCT No.: PCT/JP2004/018579

§ 371 (c)(1),
(2), (4) Date: Jun. 13, 2007

(87) PCT Pub. No.: WO2006/064534

PCT Pub. Date: Jun. 22, 2006

(65) Prior Publication Data

US 2008/0128887 A1 Jun. 5, 2008

(51) Int. Cl.
*H01L 23/488* (2006.01)
(52) U.S. Cl. .................. 257/734; 257/690; 257/741; 257/772; 257/E23.026
(58) Field of Classification Search ............... 257/741, 257/772, E21.508, E23.026, 690, E23.023; 438/612
See application file for complete search history.

(56) References Cited

U.S. PATENT DOCUMENTS

| 6,177,731 | B1 * | 1/2001 | Ishida et al. | 257/780 |
| 6,486,411 | B2 | 11/2002 | Miura et al. | |
| 2003/0030149 | A1 * | 2/2003 | Miura et al. | 257/772 |
| 2005/0167827 | A1 * | 8/2005 | Hayashi | 257/734 |

FOREIGN PATENT DOCUMENTS

| JP | 2000-040713 | 2/2000 |
| JP | 2002-239780 | 8/2002 |
| JP | 2004-207494 | 7/2004 |

* cited by examiner

*Primary Examiner*—Lynne A Gurley
*Assistant Examiner*—Vernon P Webb
(74) *Attorney, Agent, or Firm*—McDermott Will & Emery LLP

(57) ABSTRACT

Regarding a semiconductor device, especially the present invention suppresses disconnection of the connection structure concerned in the semiconductor device which has the electric and mechanical connection structure using solder, and aims at improving connection reliability. And to achieve the above objects, the semiconductor device has the solder bump which electrically connects a semiconductor chip and a package substrate, the under-filling resin with which it filled up between the semiconductor chip and the package substrate, and a solder ball which electrically connects a package substrate with the outside, and the solder bump's elastic modulus is made lower than the elastic modulus of a solder ball.

8 Claims, 7 Drawing Sheets

F I G . 5 A
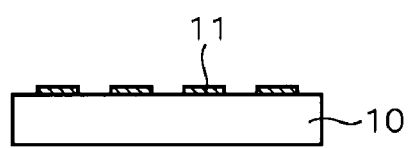
F I G . 5 B
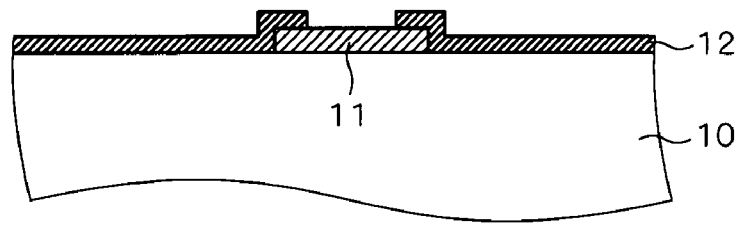
F I G . 6
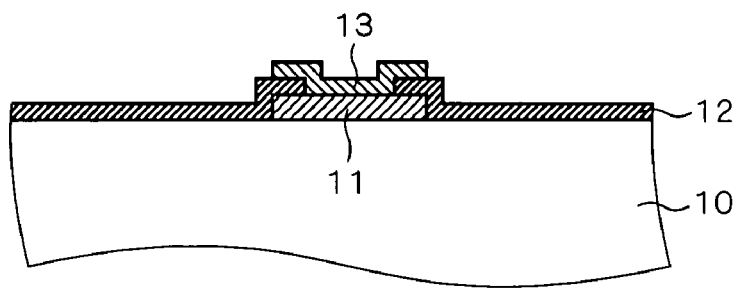

F I G. 7 A
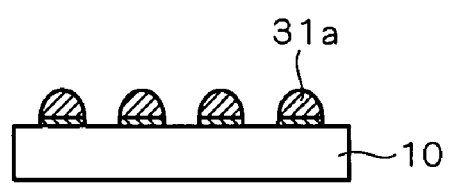
F I G. 7 B
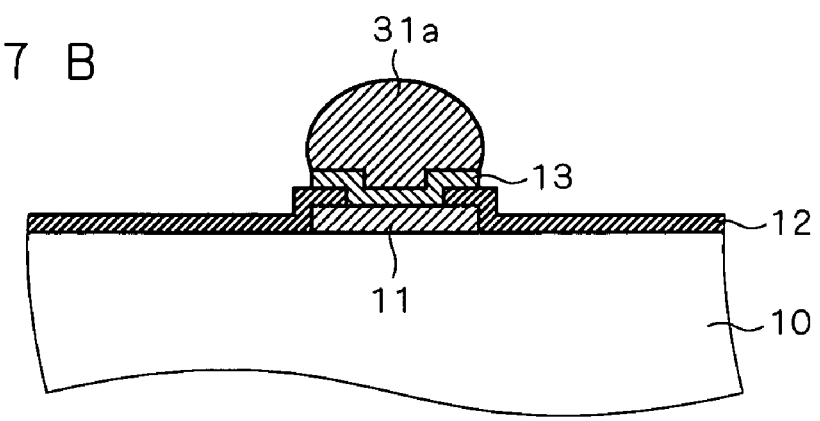

F I G. 1 1
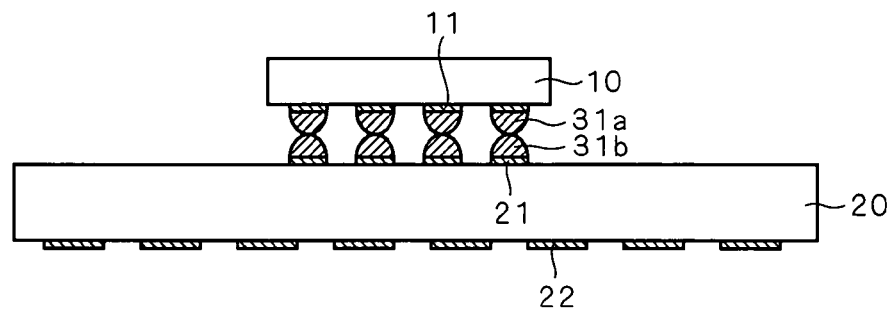
F I G. 1 2
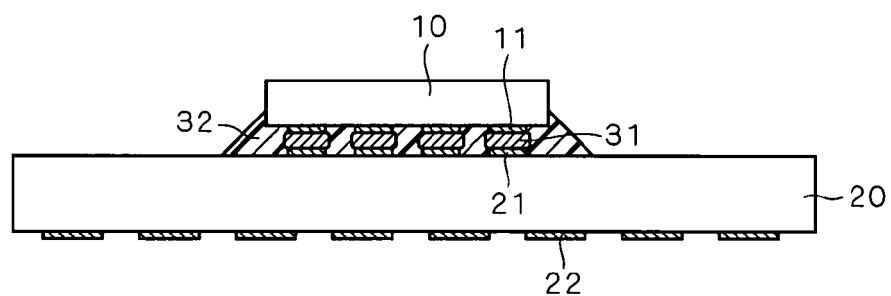
F I G. 1 3
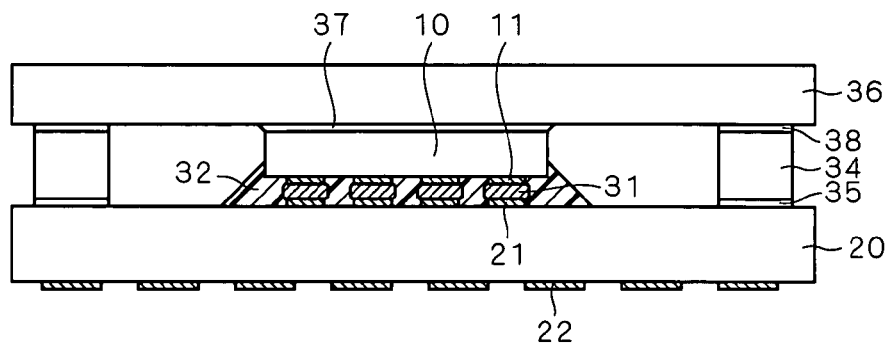

SEMICONDUCTOR DEVICE HAVING ELASTIC SOLDER BUMP TO PREVENT DISCONNECTION

INCORPORATION BY REFERENCE

The present application claims priority from PCT application PCT/JP2004/018579 filed on Dec. 13, 2004, the content of which is hereby incorporated by reference into this application.

TECHNICAL FIELD

The present invention relates to a semiconductor device and relates to the semiconductor device which has the electric and mechanical connection structure using solder especially.

BACKGROUND ART

Flip chip bonding is known as one of the assembly technology of a semiconductor device. This bonding method is a method which sticks the connection pad (only henceforth a "pad") formed in the under surface of the semiconductor chip, and the pad formed in the package substrate upper surface, applies heat and pressure, and is joined. On each pad of a semiconductor chip and a package substrate, the solder bump of ball state is beforehand formed in the case. Usually, the solder bump is put in order in a lattice manner, and such a structure is called BGA (Ball Grid Array) structure.

Conventionally, Sn(tin)-Pb (lead) eutectic solder was used as solder used for a solder bump. However, in recent years, in order to inhibit the bad influence to the environment at the time of doing disposal treatment of the electronic parts, the so-called lead free solder that does not include Pb as a solder alloy is used widely.

As lead free solder used for a solder bump, the solder alloy of the so-called "Sn—Ag—Cu system" which comprises Sn, Ag (silver), and Cu (copper) is known widely. The solder alloy which consists of Ag:3-4 mass %, Cu:0.5-1.0 mass %, and Sn as the remainder especially was common. However, the solder alloy for solder bumps which did not use Ag expensive in material price so much (below 2 mass %), but was excellent in joining reliability and dropping impact-proof nature is also proposed (for example, following Patent Reference 1).

In connection with the microfabrication of a semiconductor chip, the pad size of the semiconductor chip is also small. Therefore, a solder bump's volume and the junction area of a solder bump and a pad will become small inevitably, and the strength of a junction portion will fall. Usually, in order to compensate it, both gap is filled up with under-filling resin, such as an epoxy resin, after doing bonding of the semiconductor chip to a package substrate. Under-filling resin pastes up between a semiconductor chip and a package substrate, and it makes the external force concerning a solder bump's junction ease.

On the other hand, the electrode for external connection is formed in the under surface of the package substrate of a semiconductor device. The solder ball used when mounted in mounting substrates, such as a mother board of a computer, on it is formed. And when mounted, the semiconductor device concerned is soldered to a mounting substrate by mounting a semiconductor device on a mounting substrate and heating (reflowing) it so that a solder ball may contact the connection pad of a mounting substrate.

Usually, so that it may not melt with heating of an assembling step, as for the solder bump as internal wiring which connects a semiconductor chip and a package substrate, what has a melting point higher than the solder ball as external wiring under a package substrate is used. By using what has a small ratio over the volume at the time of solid of the volume difference of a volume at the time of solid and a volume at the time of melting as a solder bump's material, even when it melts with heating at the time of mounting, there is also technology of preventing the short circuit between solder bumps (for example, following Patent Reference 2).

For convenience of explanation, the solder bump as internal wiring which connects a package substrate with a semiconductor chip may be hereafter called an "inner bump", and the solder ball as external wiring which connects a package substrate with the outside (mother board etc.) may be called an "outer ball".

[Patent Reference 1] Japanese Unexamined Patent Publication No. 2002-239780

[Patent Reference 2] Japanese Unexamined Patent Publication No. 2004-207494

Although the coefficient of thermal expansion of the semiconductor chip of common silicon is about 7 ppm/° C. here, the package substrate and mounting substrate of resin are about 20 ppm/° C., and under-filling resin of an epoxy resin is about 30 ppm/° C., solder is about 15 ppm/° C. and they differ from each other, respectively. Therefore, by a temperature change, internal stress occurs in a part between the semiconductor chips and package substrates inside a semiconductor device, and for the connecting part between the package substrate and mounting substrate at the time of mounting. The stress was applied to the inner bump or the outer ball, became a factor which causes disconnection, and was reducing the connection reliability of the semiconductor device.

DISCLOSURE OF THE INVENTION

The present invention aims at offering the semiconductor device which is made in order to solve the above problems and which can suppress the disconnection by stress of connection structure using solder, and can acquire high connection reliability.

A semiconductor device concerning the present invention comprises a semiconductor chip, a package substrate over which the semiconductor chip is mounted, a solder bump which electrically connects the semiconductor chip and the package substrate, under-filling resin which fills up between the semiconductor chip and the package substrate, and a solder ball which electrically connects the package substrate with an outside, wherein the solder bump's elastic modulus is lower than an elastic modulus of the solder ball.

According to the semiconductor device concerning the present invention, since the elastic modulus is low, the inner bump can buffer the stress resulting from the difference in the coefficient of thermal expansion of a solder bump and under-filling resin. Therefore, the stress concentration to the connection portion of a solder bump and a semiconductor chip and the connection portion of a solder bump and a package substrate can be eased. Since the elastic modulus is high, the solder ball can hold the stress applied from the outside as self internal stress. Therefore, a solder ball can absorb the stress resulting from the difference in the coefficient of thermal expansion of a package substrate, and the mounting substrate which does external connection at the time of mounting, and the stress concentration to the peripheral part of a package substrate is eased. Therefore, disconnection between a package substrate and a mounting substrate can be suppressed. As a result, the connection reliability of the internal wiring of a semiconductor device and the connection reliability with external wiring at the time of mounting can be improved.

The purpose, the feature, aspect, and advantage of this invention become clearer with the following detailed explanation and accompanying drawings.

BRIEF DESCRIPTION OF THE DRAWINGS

FIGS. 5A to 13 are process charts for explaining the manufacturing method of the semiconductor device concerning an embodiment.

BEST MODE FOR CARRYING OUT THE INVENTION

Figure 1:
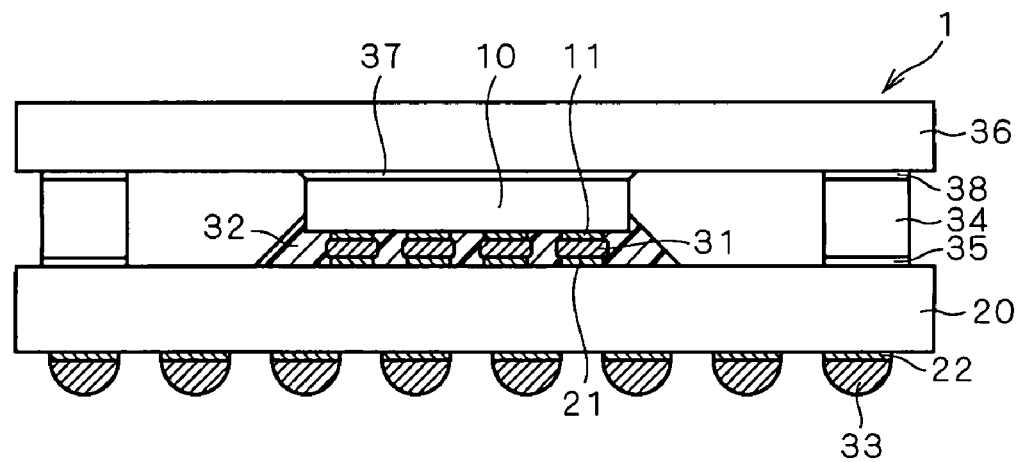
FIG. 1 is a drawing showing the structure of the semiconductor device concerning an embodiment.

FIG. 1 is a drawing showing the structure of the semiconductor device concerning an embodiment of the invention. The semiconductor device 1 concerned has BGA structure, and BGA substrate (package substrate) 20 is equipped with semiconductor chip 10 by the face down method. On the under surface (integrated circuit surface), semiconductor chip 10 has a plurality of first pads 11. BGA substrate 20 has a plurality of second pads 21 as an internal electrode on the upper surface (mounting surface of semiconductor 1 chip). Both first pad 11 and second pad 21 are connected to solder bump (inner bump) 31 electrically and mechanically. Thereby, it electrically connects with BGA substrate 20, and semiconductor chip 10 is fixed mechanically.

The gap of semiconductor chip 10 and BGA substrate 20 is filled up with under-filling resin 32, such as an epoxy resin. Under-filling resin 32 pastes up between semiconductor chip 10 and BGA substrates 20, and it functions as easing the external force concerning the junction portion of first pad 11 and second pad 21, and inner bump 31.

Figure 2:
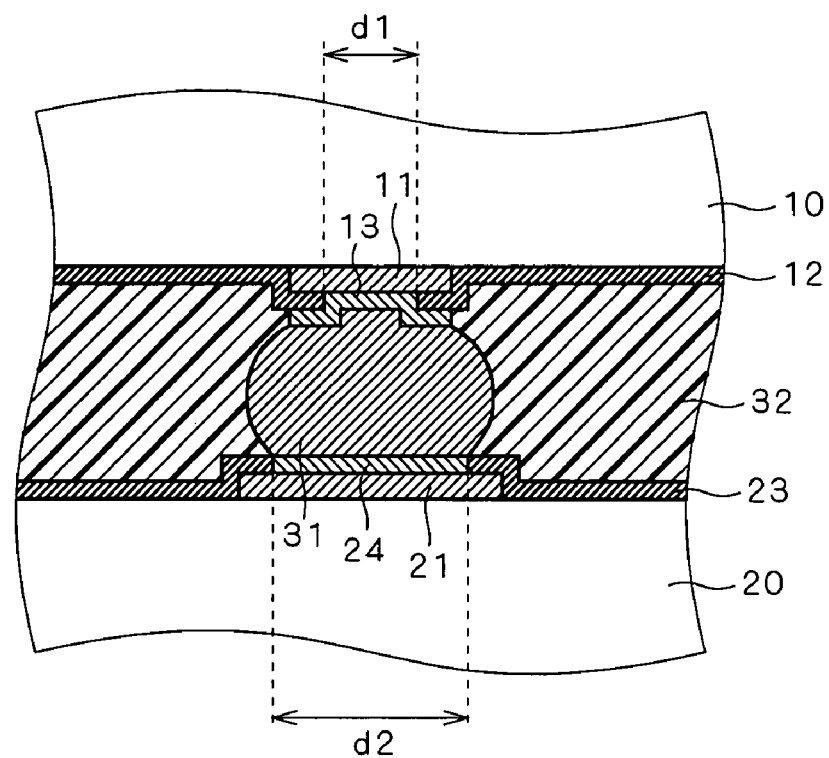
FIG. 2 is an enlarged sectional view of the connection portion of a semiconductor chip and a BGA substrate in the semiconductor device concerning an embodiment.

The enlarged view for a connecting part of semiconductor chip 10 and BGA substrate 20 is shown in FIG. 2. Although the illustration by FIG. 1 was omitted, passivation film 12 is formed in the under surface of semiconductor chip 10, and it has structure that the front surface of first pad 11 exposes to the opening formed in the passivation film 12 concerned. At this embodiment, first pad 11 of semiconductor chip 10 is formed with aluminum. Since aluminum does not get wet easily in solder, like FIG. 2, under bump metal (UBM) 13 (first metallic film) with sufficient wettability with solder is formed in the front surface of first pad 11, and inner bump 31 connects with first pad 11 via the UBM13 concerned. Thereby, the connection reliability of first pad 11 and inner bump 31 improves. As UBM13, the thing of the three-layer structure by Ti (titanium), Cu, and Ni is known, for example.

Insulating film 23 (following "solder resist 23") (second metallic film) called solder resist is formed in the upper surface of BGA substrate 20. It has structure that the front surface of second pad 21 exposes to the opening formed in solder resist 23. Solder resist 23 has prevented that excessive solder adheres to the uppermost wiring layer to which the second pad 21 concerned belongs in the case of soldering to second pad 21. In this embodiment, second pad 21 is formed with copper. Although wettability of copper with solder is comparatively good, in the purpose which prevents a "erosion phenomenon", coating (plating) 24 by a predetermined metal is performed to the front surface of second pad 21.

An "erosion phenomenon" is a phenomenon in which other metal concerned will be eroded when other metal is touched, after Sn and Ag have melted. It will become a cause of disconnection when an electrode is eroded by solder according to this phenomenon. Although Pb plays the role of a barrier and the "erosion phenomenon" of the electrode did not happen easily in the eutectic solder of the conventional Sn—Pb system, the Pb is not included in lead free solder, and an "erosion phenomenon" becomes remarkable. As coating 24, the thing of the two-layer structure by Ni (nickel) and Au (gold) is known, for example. In this embodiment, since inner bump 31 is formed on second pad 21 via coating 24, without forming directly on second pad 21, this "erosion phenomenon" is prevented. Thereby, lowering of the connection reliability of second pad 21 and inner bump 31 is suppressed.

A plurality of external electrodes 22 for electrically connecting semiconductor device 1 with the outside are formed in the under surface (external connection surface) of BGA substrate 20, and solder ball (outer ball) 33 is formed in each of these external electrode 22. Outer ball 33 is used for connecting semiconductor device 1 to mounting substrates, such as a mother board, electrically and mechanically.

Stiffener (reinforcement) 34 is formed in the BGA substrate 20 upper surface via adhesive tape 35. As for the material of stiffener 34, what has a near coefficient of linear expansion with BGA substrate 20 is desirable, for example, it comprises copper so that the generation of the stress resulting from the temperature change by generation of heat of semiconductor chip 10 etc. may be suppressed. Adhesive tape 35 is formed, for example with resin of an epoxy system with high adhesive property.

Heat spreader 36 is formed in the upper part of semiconductor chip 10 for the purpose of the improvement in heat radiation property, and protection of semiconductor chip 10. It fills up with heat radiation resin 37 between heat spreader 36 and semiconductor chip 10. This heat radiation resin 37 is formed with silver paste with high thermal conductivity so that heat spreader 36 and semiconductor chip 10 may connect thermally. Heat spreader 36 is fixed also to stiffener 34 via adhesive tape 38. Adhesive tape 38 is formed, for example with resin of an epoxy system with high adhesive property.

Figure 3:
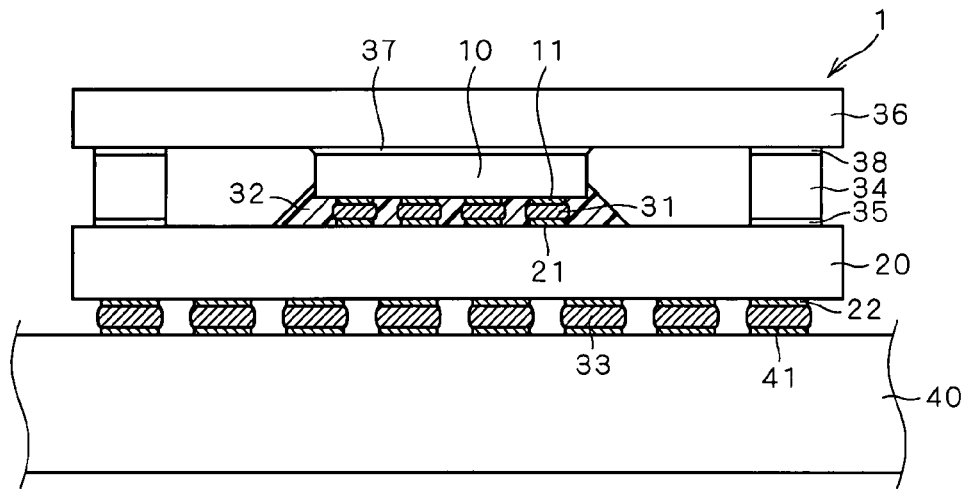
FIG. 3 is a drawing showing the semiconductor device structure at the time of mounting.

At the time of the actual use of the semiconductor device 1 concerned, it is mounted on mounting substrate 40 like FIG. 3 by joining outer ball 33 to connection pad 41 of the mounting substrate 40 upper surface. At this time, under-filling resin is not formed between BGA substrate 20 and mounting substrate 40.

In this embodiment, a solder alloy with a low elastic modulus is used as inner bump 31 which connects between semiconductor chip 10 and BGA substrates 20, and the solder alloy whose elastic modulus is higher than inner bump 31 is used as outer ball 33 for external connection. An elastic modulus is expressed with the ratio of strain and stress when stress is applied to an object, and is defined by "elastic-modulus=stress/strain." That is, the solder alloy with a low elastic modulus is easy to deform with stress, and excellent in ductility. On the contrary, the solder alloy with a high elastic modulus cannot deform easily due to stress, and strength is highly excellent in fatigue resistance.

Action and the effect that the semiconductor device concerning this embodiment performs so hereafter are explained.

As stated previously, semiconductor chip 10, BGA substrate 20, under-filling resin 32, solder (inner bump 31 and outer ball 33), and mounting substrate 40 by which external connection is done usually have a coefficient of thermal expansion different, respectively. Therefore, stress occurs into each connection portion by a temperature change.

Between semiconductor chip 10 and BGA substrate 20, mechanical connection has accomplished by two, inner bump 31 and under-filling resin 32. Therefore, the stress resulting from the difference in the coefficient of thermal expansion of semiconductor chip 10 and BGA substrate 20 is not only applied, but the stress of the longitudinal direction resulting from the difference in the coefficient of thermal expansion of inner bump 31 and under-filling resin 32 is applied to inner bump 31. That is, although under-filling resin 32 is easing the stress of the horizontal direction applied to inner bump 31, it is a factor which increases the stress of a longitudinal direction conversely.

When a coefficient of thermal expansion is larger than inner bump 31 like an epoxy resin in under-filling resin 32, the tensile stress of a longitudinal direction is applied to inner bump 31. The tensile stress concerned increases especially near the center of semiconductor chip 10 by a "warp" of semiconductor chip 10 resulting from the coefficients of thermal expansion of semiconductor chip 10 and BGA substrate 20 differing. The stress cannot be buffered as inner bump 31 is material with a high elastic modulus at this time, but stress concentrates on the connection portion of inner bump 31 and semiconductor chip 10, and the connection portion of inner bump 31 and BGA substrate 20, and it becomes easy to generate disconnection in those portions.

When the connection portion of inner bump 31, and semiconductor chip 10 and BGA substrate 20 is structure like FIG. 2, it is especially easy to generate disconnection between first pad 11 and UBM13. Since diameter d1 of the opening of passivation film 12 which first pad 11 exposes is smaller than diameter d2 of the opening of solder resist 23 which second pad 21 exposes (that is, the area of the joint surface (interface) of first pad 11 and UBM13 is smaller than the area of the joint surface of second pad 21 and coating 24), it is because stress will concentrate on the interface of first pad 11 and UBM13. Since in other words the electric connection area to inner bump 31 in first pad 11 front surface is smaller than the electric connection area in second pad 21 front surface, it becomes easy to disconnect electric connection with first pad 11 and inner bump 31.

So, in this embodiment, a solder alloy with a low elastic modulus as inner bump 31 is used. Since inner bump 31 with a low elastic modulus is easy to deform according to stress, it can buffer the tensile stress applied to inner bump 31. The stress concentration to the connection portion of inner bump 31 and semiconductor chip 10 and the connection portion of inner bump 31 and BGA substrate 20 is eased. Therefore, disconnection between semiconductor chip 10 and BGA substrate 20 can be suppressed, and the connection reliability between semiconductor chip 10 and BGA substrate 20 improves.

In this embodiment, the exposure area (size of first pad 11) of first pad 11 is made small like FIG. 2 in order to contribute to high integration of semiconductor chip 10. According to the present invention, since the stress applied to the interface of first pad 11 and UBM13 is eased, even if it makes size of first pad 11 small, lowering of connection reliability is suppressed.

Next, outer ball 33 between BGA substrate 20 and mounting substrate 40 at the time of mounting is explained. As mentioned above, under-filling resin is not formed between BGA substrate 20 and mounting substrate 40, but it connects only with outer ball 33. BGA substrate 20 and mounting substrate 40 have strength higher than semiconductor chip 10, do not generate a "warp" easily, and seldom generate the stress of a longitudinal direction. Therefore, the stress of the horizontal direction resulting from the difference in the coefficient of thermal expansion of BGA substrate 20 and mounting substrate 40 is mainly applied to outer ball 33. External electrode 22 of BGA substrate 20 and connection pad 41 of mounting substrate 40 have large size, the area of the joint surface of outer ball 33 and them is large, and the strength to a tensile stress is high from the first. Therefore, to have only the firmness which can absorb the stress of a horizontal direction is desired, especially concerning outer ball 33.

Usually, stress resulting from the difference in the coefficient of thermal expansion of BGA substrate 20 and mounting substrate 40 tends to concentrate on the peripheral part of BGA substrate 20. When outer ball 33 is material with a low elastic modulus, each outer ball 33 will deform, and stress will not be absorbed, but stress will escape to the peripheral part of BGA substrate 20. Thereby, the stress applied to outer ball 33 of a peripheral part will increase. Outer ball 33 is damaged by the result, especially at the peripheral part of BGA substrate 20, and it becomes easy to generate disconnection.

So, in this embodiment, a solder alloy with a high elastic modulus as outer ball 33 is used. Outer ball 33 with a high elastic modulus cannot deform easily according to stress, and the stress applied from the outside can be held as self internal stress. Therefore, each of each outer ball 33 can absorb the stress resulting from the difference in the coefficient of thermal expansion of BGA substrate 20 and mounting substrate 40, and the stress concentration to outer ball 33 of the peripheral part of BGA substrate 20 is eased. Therefore, disconnection between BGA substrate 20 and mounting substrate 40 can be suppressed, and the connection reliability between BGA substrate 20 and mounting substrate 40 improves.

Thus, by using a solder alloy with a low elastic modulus as inner bump 31, and using a solder alloy with a high elastic modulus as outer ball 33, the connection reliability between semiconductor chip 10 and BGA substrate 20 and between BGA substrate 20 and mounting substrate 40 can be improved.

As mentioned above, the thing of a Sn—Ag—Cu system is common as lead free solder used for a solder bump and a solder ball. The elastic modulus of a Sn—Ag—Cu system solder alloy is mostly decided by the ratio (mass %) of Ag included in it. Usually, an elastic modulus becomes high as the ratio of Ag increases. Therefore, what is necessary is to use a solder alloy with few ratios of Ag for inner bump 31, and just to use a solder alloy with many ratios of Ag for outer ball 33, in applying a Sn—Ag—Cu system solder alloy as inner bump 31 and outer ball 33 of this embodiment. Thereby, inner bump's 31 elastic modulus becomes low, and the elastic modulus of outer ball 33 becomes high.

The present inventor conducted the experiment for acquiring composition of a solder alloy with high connection reliability. In the experiment, durability test (heat cycle test) to a repetition of a temperature change was done about the semiconductor device of structure of having been shown in FIG. 1. As inner bump 31 and outer ball 33, the solder alloy of the Sn—Ag—Cu system was used.

As a result of the experiment, when the ratio of Ag was 0-1.5 mass % as inner bump 31, the outstanding durability was acquired. As outer ball 33, in the case that the ratio of Ag is more than 2.5 mass %, desirably more than 3%, the excellent durability was acquired. "Ag:0 mass %" has referred to what (only Cu and Sn are comprised) Ag is not included for. That is, a present inventor found out that when applying the solder alloy of a Sn—Ag—Cu system to the present invention by the experiment concerned, the high connection reliability of semiconductor device 1 was acquired by using the thing of Ag of 0-1.5 mass % as inner bump 31, and using the thing of Ag of 2.5 mass % (desirably 3% or more) as outer ball 33.

Figure 4:
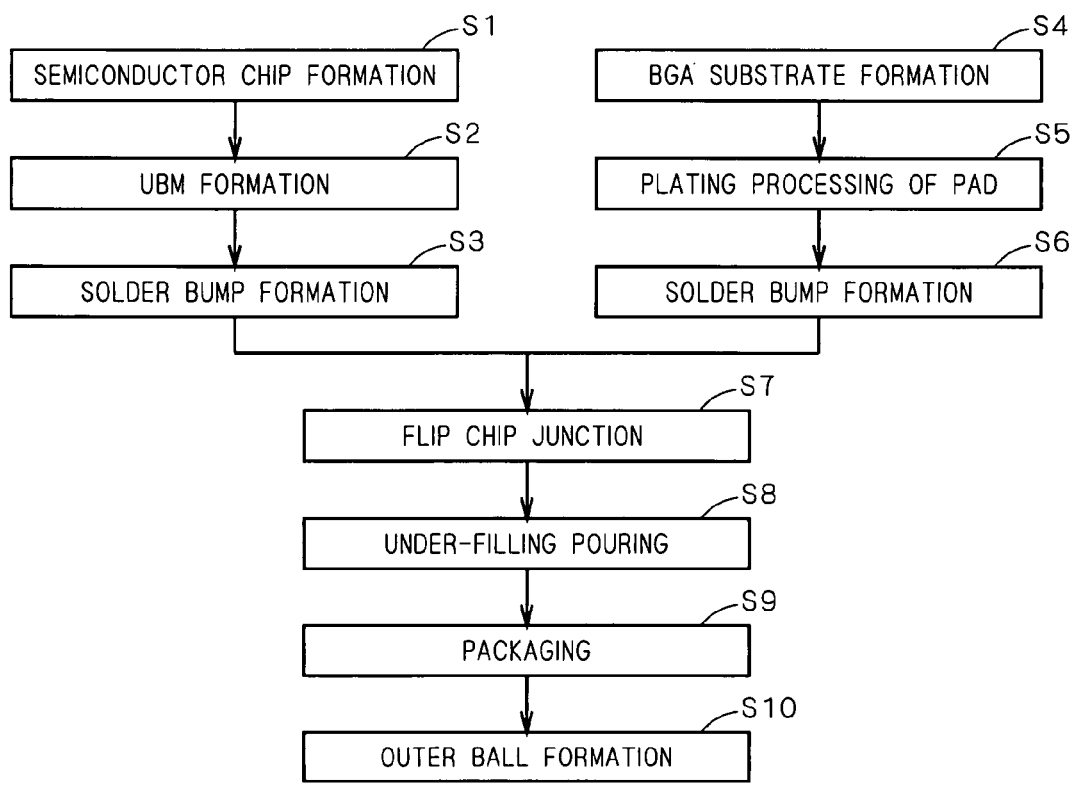
FIG. 4 is a flow diagram showing the manufacturing method of the semiconductor device concerning an embodiment.

Next, the manufacturing method of the semiconductor device concerning the present invention is explained with reference to the flow diagram of FIG. 4. FIG. 5A-FIG. 13 are the drawings for explaining the manufacturing process concerned. In these FIGS. 5-FIGS. 13, the same reference is given to the same element as what was shown in FIG. 1.

Semiconductor chip 10 which has first pad 11 of aluminum on a front surface is first formed like FIG. 5A (S1). FIG. 5B shows the enlarged section of first pad 11 of semiconductor chip 10 front surface. Passivation film 12 is formed in the front surface of semiconductor chip 10, and the opening which first pad 11 exposes is formed in passivation film 12.

And like FIG. 6, UBM13 for improving wettability with solder is formed in the front surface of first pad 11 (S2). This UBM13 is formed by doing sputtering of Ti, Cu, and Ni one by one, and patterning after that on semiconductor chip 10. And like FIGS. 7A and 7B, solder alloy 31a which constitutes inner bump 31 is formed on first pad 11 through UBM13 by screen printing the soldering paste which comprises Ag:1.0 mass %, Cu:0.5 mass %, and remainder Sn (S3).

Figure 8A:
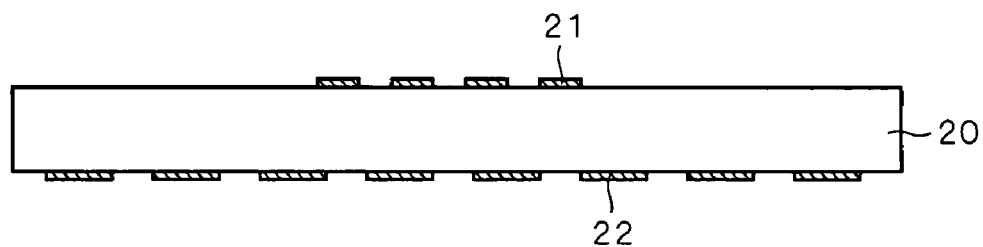
Figure 8B:
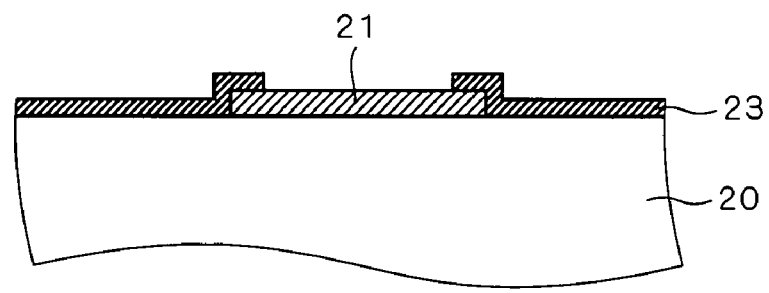

Apart from the above-mentioned step, BGA substrate 20 which has second pad 21 for connecting with semiconductor chip 10 and external electrode 22 for connecting outside (mounting substrate) is formed like FIG. 8A (S4). FIG. 8B shows the enlarged section of second pad 21 of BGA substrate 20 front surface. Solder resist 23 is formed in the front surface of BGA substrate 20, and an opening which second pad 21 exposes to solder resist 23 is formed.

Figure 9:
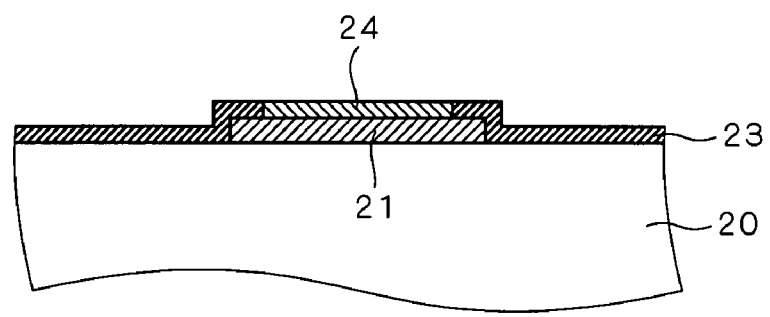
Figure 10A:
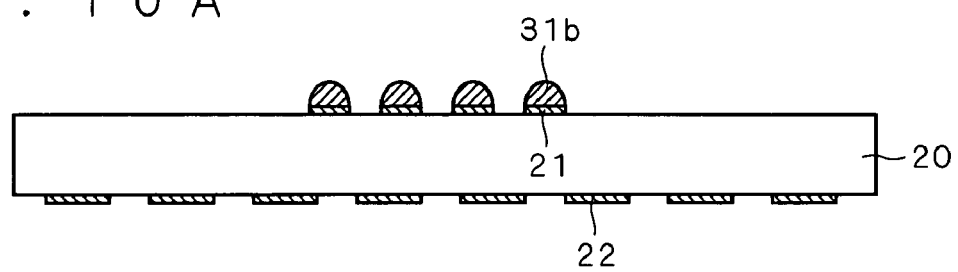
Figure 10B:
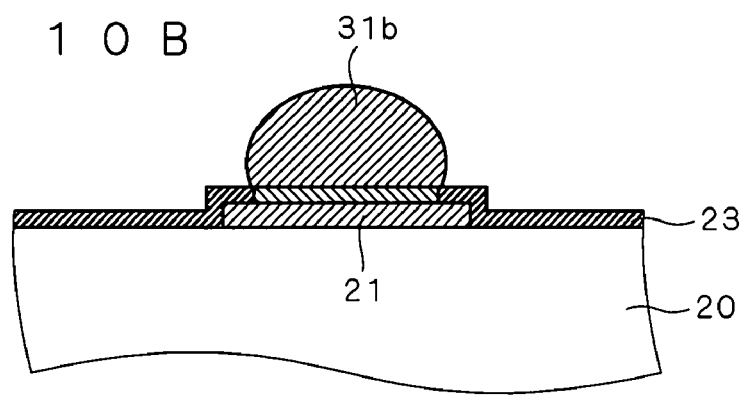

And like FIG. 9, coating 24 which prevents the "erosion phenomenon" of second pad 21 by solder is formed. This coating 24 is formed on second pad 21 by forming Ni and Au one by one by electroless plating (S5). And like FIGS. 10A and 10B, solder alloy 31b which constitutes inner bump 31 is formed on second pad 21 through coating 24 by screen printing of the soldering paste which comprises Ag:1.0 mass %, Cu:0.5 mass %, and remainder Sn (S6).

And solder alloy 31a of semiconductor chip 10 and solder alloy 31b of BGA substrate 20 are stuck like FIG. 11, and the so-called flip chip junction that applies heat and pressure and is joined is performed (S7). When solder alloy 31a and solder alloy 31b join, inner bump 31 is formed and semiconductor chip 10 and BGA substrate 20 are connected. In this embodiment, since both composition of solder alloys 31a and 31b is Ag:1.0 mass %, Cu:0.5 mass %, and remainder Sn, it constitutes the same Ag:1.0 mass %, Cu:0.5 mass %, and remainder Sn as to inner bump's 31 composition which joins the two and is formed.

Subsequently, under-filling resin 32 is formed like FIG. 12 by pouring in an epoxy resin between semiconductor chip 10 and BGA substrate 20 (S8).

Packaging of a semiconductor device is performed (S9). That is, like FIG. 13, on BGA substrate 20, adhesive tape 35 is used, stiffener 34 is fixed, and it equips with heat spreader 36 via heat radiation resin 37 on semiconductor chip 10. At this time, on stiffener 34, adhesive tape 38 is used and heat spreader 36 is fixed.

And finally the solder ball which comprises Ag:3.0 mass %, Cu:0.5 mass %, and remainder Sn is mechanically mounted on external electrode 22 of BGA substrate 20 under surface, and outer ball 33 is formed on external electrode 22 by doing melting of this solder ball by reflow (S10). Thereby outer ball 33 which comprises Ag:3.0 mass %, Cu:0.5 mass %, and remainder Sn is formed, and semiconductor device 1 shown in FIG. 1 is formed.

Semiconductor device 1 is mounted in the upper surface of mounting substrate 40 so that outer ball 33 and connection pad 41 may touch, melting of the outer ball 33 is done by reflow, and it is made to join to connection pad 41 at the time of actual use. As a result, as shown in FIG. 3, semiconductor device 1 is mounted on mounting substrate 40.

In this embodiment, under-filling resin is not formed between BGA substrate 20 and mounting substrate 40 at the time of mounting. By not forming under-filling resin, it can be prevented that the stress of a longitudinal direction occurs originating in the difference in the coefficient of thermal expansion of under-filling resin and outer ball 33, and reduction of the number of manufacturing processes and a manufacturing cost can be aimed at.

As mentioned above, the semiconductor device concerning this embodiment is provided with outer ball 33 with a comparatively high elastic modulus with inner bump 31 with a comparatively low elastic modulus. Inner bump 31 can buffer the stress resulting from the difference in the coefficient of thermal expansion of inner bump 31 and under-filling resin 32 by deforming according to stress. The stress concentration to the connection portion of inner bump 31, and semiconductor chip 10 and BGA substrate 20 can be eased. When high integration of semiconductor chip 10 progresses, the area of the electric connection portion (namely, interface of first pad 11 and inner bump 31 shown in FIG. 2) to inner bump 31 in first pad 11 front surface will become small, and strength will fall, but by buffering stress, inner bump 31 can prevent disconnection in the portion.

Outer ball 33 can hold the stress applied from the outside as self internal stress. Therefore, each of each outer ball 33 can absorb the stress resulting from the difference in the coefficient of thermal expansion of BGA substrate 20 and mounting substrate 40. The stress concentration to outer ball 33 of the peripheral part of BGA substrate 20 is eased. Therefore, disconnection between BGA substrate 20 and mounting substrate 40 can be suppressed. Thus, according to this embodiment, the connection reliability of internal wiring and the connection reliability with external wiring at the time of mounting of semiconductor device 1 can be improved.

In this embodiment, connection of BGA substrate 20 and mounting substrate 40 at the time of mounting is made only with outer ball 33, and under-filling resin is not formed between both. That is because outer ball 33 with a high elastic modulus has sufficient strength and under-filling resin is unnecessary. The advantage that the generation of the stress resulting from the difference in the coefficient of thermal expansion of the under-filling resin and outer ball 33 is prevented, and the effect that the rise of the number of manufacturing processes and a manufacturing cost is suppressed are also acquired.

Since, as for the elastic modulus of a Sn—Ag—Cu system solder alloy, an elastic modulus becomes high as the ratio of Ag increases as stated previously, what is necessary is to use a solder alloy with few ratios of Ag for inner bump 31, and just to use a solder alloy with many ratios of Ag for outer ball 33, in applying a Sn—Ag—Cu system solder alloy as inner bump 31 and outer ball 33. When the ratio of inner bump's 31 Ag was made into 0-1.5 mass % and the ratio of Ag of outer ball 33 was done to more than 2.5 mass % (desirably 3% or more), it turned out that the especially excellent connection reliability is acquired by the experiment of a present inventor. When applying a Sn—Ag—Cu system solder alloy as inner bump 31 and outer ball 33, it can contribute to lead free-ization of a semiconductor device. However, as long as it can make inner bump's 31 elastic modulus low and can make the elastic modulus of outer ball 33 high, solder alloys other than a Sn—Ag—Cu system may be used.

This embodiment showed the structure which formed UBM13 and coating 24 in the front surface of first pad 11, and the front surface of second pad 21, respectively like FIG. 2. However, when the material which is excellent in wettability with solder, and is hard to be eroded is used, for example as first pad 11 and second pad 21, the need of forming UBM13 and coating 24 is lost. In that case, it may be the structure that inner bump 31 joins to first pad 11 and second pad 21 directly. It is clear that the above-mentioned effect is acquired also in the case.

Although the thing of the three-layer structure by Ti, Cu, and Ni was exemplified as UBM13 and the two-layer structure thing by Ni and Au was exemplified as coating 24, respectively, it is not limited to them. For example, Ni free's UBM, coating of an electrode, etc. may be used.

Although screen printing of soldering paste performed the forming step (Step S3 of FIG. 3) of solder alloy 31a to semiconductor chip 10, and the forming step (Step S6 of FIG. 3) of solder alloy 31b to BGA substrate 20 in both the above-mentioned manufacturing processes, those both or one of the two may be performed by other techniques, such as an electrolysis electroplating method. However, in an electrolysis electroplating method, solder alloys 31a and 31b which comprise three or more sorts of metal cannot be formed. Therefore, one side of solder alloys 31a and 31b is formed with the solder alloy which comprises Sn and Ag, for example and the other is formed with the solder alloy which comprises Sn and Cu to form inner bump 31 of a Sn—Ag—Cu system with an electrolysis electroplating method. At the bonding step (Step S7 of FIG. 3) of subsequent semiconductor chip 10 and BGA substrate 20, melted solder alloys 31a and 31b are mixed, and inner bump 31 of a Sn—Ag—Cu system is formed as a result.

In this embodiment, although the package structure which has stiffener 34 and heat spreader 36 like FIG. 1 was shown, application of the present invention is not limited to this structure. For example, it may be the structure which has only one of the two of stiffener 34 and heat spreader 36, may be the structure where it does not have both, and may be the structure which replaced with stiffener 34 and heat spreader 36, and covered the upper surface with mold resin.

Although this invention was explained in detail, the above-mentioned explanation is exemplification in all the aspects, and this invention is not limited to it. The countless modification which is not exemplified is understood as what may be assumed without separating from the scope of this invention.

The invention claimed is:

1. A semiconductor device, comprising:
a semiconductor chip;
a package substrate over which the semiconductor chip is mounted;
a solder bump which electrically connects the semiconductor chip and the package substrate and which does not include Pb as a solder alloy;
under-filling resin which fills up between the semiconductor chip and the package substrate; and
a solder ball which electrically connects the package substrate with an outside and which does not include Pb as a solder alloy;
wherein
the solder bump's elastic modulus is lower than an elastic modulus of the solder ball,
the solder bump and the solder ball includes Ag and Cu, and remainder includes Sn, and
a ratio of a mass of Ag in the solder bump is smaller than a ratio of a mass of Ag in the solder ball.

2. A semiconductor device according to claim 1, wherein ratio of Ag in the solder bump is less than 1.5 mass %.

3. A semiconductor device according to claim 1, wherein ratio of Ag in the solder ball is more than 2.5 mass %.

4. A semiconductor device according to claim 1, wherein
the solder bump includes Cu, and remainder includes Sn; and the solder ball includes Ag and Cu, and remainder includes Sn.

5. A semiconductor device according to claim 4, wherein ratio of Ag in the solder ball is more than 2.5 mass %.

6. A semiconductor device according to claim 1, further comprising:
a mounting substrate which mounts the package substrate; wherein
the mounting substrate is electrically connected to the package substrate via the solder ball; and
under-filling resin is not formed between the mounting substrate and the package substrate.

7. A semiconductor device according to claim 1, wherein
the semiconductor chip has a first pad electrically connected with the solder bump;
the package substrate has a second pad electrically connected with the solder bump; and
an electric connection area to the solder bump in the first pad surface is smaller than an electric connection area to the solder bump in the second pad surface.

8. A semiconductor device according to claim 1, wherein
the semiconductor chip has a first pad electrically connected to the solder bump;
the package substrate has a second pad electrically connected to the solder bump;
a predetermined first metallic film is formed in a front surface, and the first pad is connected to the solder bump via the first metallic film concerned;
a predetermined second metallic film is formed in a front surface, and the second pad is connected to the solder bump via the second metallic film concerned; and
an area of an interface of the first pad and the first metallic film is smaller than an area of an interface of the second pad and the second metallic film.

* * * * *